United States Patent [19]

Rebeschini

[11] Patent Number: 4,706,036
[45] Date of Patent: Nov. 10, 1987

[54] DIFFERENTIAL AMPLIFIER HAVING RATIOED LOAD DEVICES

[75] Inventor: Michael E. Rebeschini, Hanover Park, Ill.

[73] Assignee: Motorola, Inc., Schaumburg, Ill.

[21] Appl. No.: 944,404

[22] Filed: Dec. 22, 1986

[51] Int. Cl.[4] .......................... H03F 3/45; H03F 3/30; H03F 3/16
[52] U.S. Cl. ..................................... 330/253; 330/257
[58] Field of Search ............... 330/253, 255, 257, 264, 330/269, 307

[56] References Cited

U.S. PATENT DOCUMENTS 4,267,517  5/1981  Iida et al. ........................ 330/264 X

OTHER PUBLICATIONS

Feldman, Len, "Anti-Negative Feedback for Hi-Fi Amplifiers", *Radio-Electronics*, Mar. 1981, vol. 52, No. 3, pp. 52-54, 87.

Primary Examiner—Eugene R. LaRoche
Assistant Examiner—Nathan W. McCutcheon
Attorney, Agent, or Firm—John A. Fisher; Jeffrey Van Myers; Robert L. King

[57] ABSTRACT

A differential amplifier is provided which has a low systematic offset voltage and a small variation in quiescent current with respect to variations in processing and temperature while providing low input referred noise and good output drive capability. Each transistor of a differential input pair of transistors is coupled to a plurality of series-connected transistors which are fabricated with substantially equal control electrode dimensions to form composite load tranistors. An output stage having conventional source and sink transistors is coupled to the differential pair of transistors. The sink transistor is implemented as a composite transistor by a plurality of parallel-connected transistors, each also having substantially the same control electrode dimension. Since all the ratioed transistors have equal control electrode dimensions, variations over processing and temperature are minimized. The composite load transistors have a large effective gate length for low input referred noise, and the composite transistor of the output stage has a small effective gate length to provide good drive capability.

6 Claims, 1 Drawing Figure

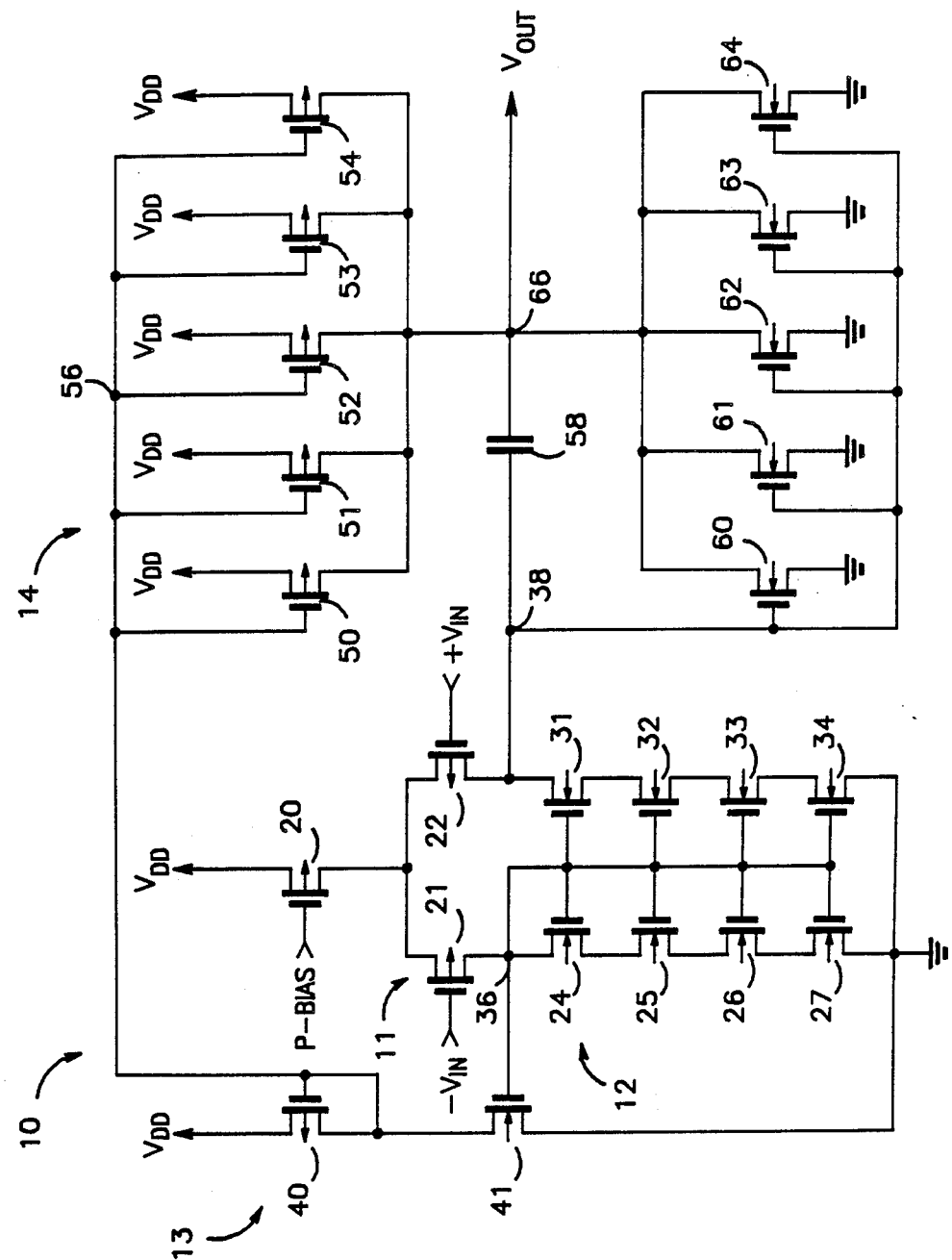

DIFFERENTIAL AMPLIFIER HAVING RATIOED LOAD DEVICES

TECHNICAL FIELD

This invention relates generally to electronic amplifier circuits, and more particularly, to differential amplifier circuits.

BACKGROUND ART

A commonly used differential amplifier structure is an amplifier which has differential input transistors and a load transistor coupled to each differential input transistor to form a differential input stage. An output stage is coupled to the differential input stage. Many efforts have previously been directed toward the problem of correcting an inherent input offset voltage associated with the differential input transistors. Many of these efforts are layout techniques, such as laying out the differential input transistors to be invariant with respect to normal electronic mask misalignment, and providing four input transistors which are configured as two cross-coupled transistor pairs to minimize offsets due to process and temperature gradients. However, as noted by Paul Gray and Robert Meyer in "MOS Operational Amplifier Design-A Tutorial Overview" in the IEEE *Journal of Solid-State Circuits,* Volume SC-17, No. 6, December 1982, pages 969-982, another offset voltage contribution known as "systematic offset voltage" is a problem in operational amplifiers. Systematic offset voltage is an offset voltage which results from the requirement of a load transistor and an output transistor coupled thereto to have differing gate-source voltages, $V_{GS}$, to insure that the quiescent output voltage of the output stage is substantially halfway between two supply voltages. Systematic offset voltage is also dependent on power supply voltage and reduces the amplifier's power supply rejection ratio. To overcome the systematic offset voltage, the current density in the load transistors and the output stage transistor needs to be equal so that when the same $V_{GS}$ exists across these transistors, the output will be substantially halfway between the two supply voltages. To force the transistors to have equal current densities, the physical geometries of the transistors are ratioed wherein the transistor gate lengths are made equal and the gate widths are ratioed accordingly. However, this gate length requirement degrades the operational amplifier performance because to obtain a low output noise level and a high low frequency gain, the gate lengths of the load transistors need to be made long, whereas the gate length of the output transistor needs to be made short to obtain a large transconductance, $g_m$, and good output drive capability. Yet, if the gate lengths of the load transistors and the output transistor are not the same, any ratio of currents set up through the load transistors and the output transistor will vary with respect to processing and temperature. Therefore, previous differential amplifier circuits have not generally been able to provide an output voltage with no systematic offset voltage and optimum power supply rejection and noise and frequency characteristics because known solutions for a specific design feature have resulted in the degradation of other design features.

BRIEF DESCRIPTION OF THE INVENTION

Accordingly, an object of the present invention is to provide an improved differential amplifier having ratioed load devices which optimize a plurality of design goals.

Another object of the present invention is to provide an improved differential amplifier which minimizes systematic offset voltage of the amplifier.

Yet another object of this invention is to provide an improved differential amplifier which improves circuit performance with improved transistor device matching.

A further object of the present invention is to provide an improved differential amplifier having improved noise characteristics and which is substantially process insensitive.

In carrying out the above and other objects of the present invention, there is provided, in one form, a differential amplifier having a differential input pair of transistors for receiving first and second input voltages. An output voltage is provided which is proportional to a differential of the first and second input voltages. A plurality of series-connected load transistors are coupled to each transistor of the differential input pair of transistors. Each of the series-connected load transistors has substantially equal first predetermined control electrode dimensions. An output stage is coupled to the differential input pair of transistors and to the first plurality of series-connected transistors. The output stage has a source output transistor and a sink output transistor. The sink output transistor is implemented by a plurality of parallel-connected sink transistors. Each of the parallel-connected sink transistors has substantially equal second predetermined control electrode dimensions ratioed with the first predetermined control electrode dimensions.

These and other objects, features and advantages will be more clearly understood from the following detailed description taken in conjunction with the accompanying drawing.

BRIEF DESCRIPTION OF THE DRAWING

The single FIGURE illustrates in schematic form a differential amplifier in accordance with the present invention.

DETAILED DESCRIPTION OF THE INVENTION

Shown in the single FIGURE is a differential amplifier 10 generally having a differential input portion 11, a load portion 12, a quiescent output drive portion 13 and an output portion 14. Differential input portion 11 comprises P-channel transistors 20, 21 and 22. P-channel transistor 20 has a source connected to a positive supply voltage, labeled "$V_{DD}$", a gate for receiving a bias voltage labeled "P-Bias", and a drain. Each of P-channel transistors 21 and 22 has a source connected to the drain of transistor 20. A gate of transistor 21 is connected to a negative input voltage labeled "$-V_{IN}$", and a gate of transistor 22 is connected to a positive input voltage labeled "$+V_{IN}$". Each of transistors 21 and 22 also has a drain.

Load portion 12 comprises a plurality of series-connected N-channel transistors 24–27 and a plurality of series-connected N-channel transistors 31–34. N-channel transistor 24 has a drain and a gate connected together and connected to the drain of transistor 21 at a node 36. A source of transistor 24 is connected to a drain of transistor 25, and a gate of transistor 25 is connected to node 36. A source of transistor 25 is connected to a drain of transistor 26, and a gate of transistor 26 is connected to node 36. A source of transistor 26 is connected to a drain of transistor 27, and a gate of transistor 27 is connected to node 36. A source of transistor 27 is connected to a ground reference. N-channel transistor 31 has a drain connected to the drain of transistor 22 at a node 38. A gate of transistor 31 is connected to the drain of transistor 21 at node 36, and a source of transistor 31 is connected to a drain of transistor 32. A gate of transistor 32 is connected to the drain of transistor 21 at node 36, and a source of transistor 32 is connected to a drain of transistor 33. A gate of transistor 33 is connected to a drain of transistor 21 at node 36, and a source of transistor 33 is connected to a drain of transistor 34. A gate of transistor 34 is connected to the drain of transistor 21 at node 36, and a source of transistor 34 is connected to the ground reference.

Quiescent output drive portion 13 comprises a P-channel transistor 40 and an N-channel transistor 41. Transistor 40 has a source connected to power supply voltage $V_{DD}$, and a gate and drain connected together and connected to a drain of transistor 41. A gate of transistor 41 is connected to node 36, and a source of transistor 41 is connected to the ground reference.

Output portion 14 comprises a plurality of P-channel transistors 50–54 coupled in parallel, a capacitor 58, and a plurality of N-channel transistors 60–64 coupled in parallel. The gate and drain of transistor 40 are connected to the gates of each of transistors 50–54 at a node 56. Each of transistors 50–54 has a source connected to positive power supply voltage $V_{DD}$, and each of transistors 50–54 has a drain connected together at an output terminal 66 for providing an output voltage, $V_{OUT}$. Capacitor 58 has a first electrode connected to node 38 and a second electrode connected to output terminal 66. Each of transistors 60–64 has a gate connected to node 38 and a drain connected to output terminal 66. A source of each of transistors 60–64 is connected to the ground reference. While specific N-channel and P-channel MOS devices are shown, it should be clear that operational amplifier 10 could be implemented by completely reversing the processing techniques (e.g. P-channel to N-channel) or by using other types of transistors In operation, input differential transistors 21 and 22 receive first and second input voltages, $-V_{IN}$ and $+V_{IN}$, respectively. Transistor 20 functions as a current source in response to the predetermined bias voltage. Series-connected transistors 24–27 function as a load device for transistor 21, and transistors 31–34 function as a load device for transistor 22. Typically, transistors 24–27 are implemented by one single transistor which functions as a load. Similarly, transistors 31–34 are typically implemented by one single transistor which also functions as a load.

Transistors 50–54 function collectively as a source transistor in output portion 14, and transistors 60–64 function collectively as a sink transistor in output portion 14 to provide output voltage $V_{OUT}$. Typically, transistors 60–64 are implemented by a single transistor. Capacitor 58 functions in a conventional manner to provide frequency stability in differential amplifier 10. Transistors 41 and 40 function in a known manner to provide additional output drive to output stage 14 during output voltage transitions. Because transistors 40 and 41 function to improve output slew rate in a previously known way, a detailed discussion of the improved output slew rate provided by transistors 40 and 41 will not be provided. Further details related to circuit operation of the conventional portions of differential amplifier 10 may be found in U.S. Pat. No. 4,383,223 entitled "CMOS Operational Amplifier Employing Push-Pull Output Stage" by Ulmer and assigned to the assignee hereof.

Up to this point in the discussion, the circuit description has focused primarily on items common between the present invention and U.S. Pat. No. 4,383,223. The present invention differs from previous circuits in that differential amplifier 10 is capable of simultaneously being substantially process independent and able to substantially eliminate systematic offset voltage and variations in quiescent current. The novelty in the present invention is, in part, related to the use of multiple series-connected transistors 24–27 and 31–34 in place of single load transistors. Further, the use of multiple transistors 60–64 in place of a single sink transistor in output portion 14 contributes to provide the improved circuit performance of the present invention. By virtue of the circuit configuration, the load transistor implemented by transistors 31–34 must have the same gate-to-source voltage, $V_{GS}$, which the sink transistor implemented by transistors 60–64 has when the amplifier inputs are at the same potential. The drain of transistor 31 will be at the same potential as its gate because of the following reasons. Firstly, series connected transistors 31–34 are matched to series connected transistors 24–27; secondly, the same current flows through each set of series-connected transistors 24–27 and 31–34; and thirdly, the drain of transistor 24 is connected to its gate. If the current density through transistors 60–64 is the same as the current density through transistors 31–34, output voltage $V_{OUT}$ will be at the same voltage potential as the gate of transistors 60–64. Therefore, both the composite output source transistor formed by transistors 50–54 and the composite output sink transistor formed by transistors 60–64 are biased in the saturation region when the inputs of amplifier 10 are at the same voltage potential. Operation in the saturation region is a necessary circuit condition for low offset voltage. In order to have the same current density flowing through the composite load transistor as through the composite output transistor, the load and output transistors need to be ratioed in accordance with the bias currents flowing through them. In order to maintain that ratio over processing variations that affect the width and length of the transistors, the width and length of the load transistor and the output transistor need to be the same. However, this design criteria is in conflict with both the need to make the load transistors have a large gate length for low input referred noise and a large low frequency gain and the need to make the output transistor have a small gate length for good output drive capability.

In the illustrated form, the present invention overcomes the problems of the previous circuits by implementing each of transistors 24–27, 31–34 and 60–64 in a manner to optimize the requirements needed to obtain all of the previously mentioned circuit performance objectives. Transistors 24–27, 31–34 and 60–64 are implemented with equal dimensioned transistors so that all vary identically with process and temperature. In a preferred form, transistors 24–27, 31–34 and 60–64 are implemented with the dimensions of "110/5" microns. It should be well understood that actual device specifications are provided by way of example only and may vary significantly from the values discussed. For the illustrated gate dimension value, the effective transistor dimension of the series connection of transistors 24-27 equals "110/20". In other words, the effective gate length of series-connected transistors 24-27 linearly adds to "20" while the gate width remains "110". However, the effective transistor dimension of transistors 60-64 adds to "550/5" which ensures that output portion 14 has a large transconductance. Although the output sink transistor is illustrated as being implemented with five parallel transistors, it should be readily understood that fewer or more parallel transistors may be implemented. In a preferred form, the number of parallel-connected output source transistors should equal the number of parallel-connected output sink transistors as further described below. More importantly, the same control electrode dimensions should be used for each of transistors 24-27, 31-34 and 60-64. The number of series-connected transistors actually used in the load device depends on the ratio of the currents required between the load transistor and the output sink transistor.

The present invention may be further improved so that transistor 41 is also fabricated with a gate dimension of "110/5". Therefore, all of transistors 41, 24-47, 31-34 and 60-64 track equally with process and temperature. Systematic offset voltage has been corrected and noise maintained at a low level by operational amplifier 10. The output source transistor may also be implemented by a plurality of five parallel-coupled transistors 50-54 which are each implemented with gate dimensions equal to that of transistor 40. Therefore, the bias current in output stage 14 is five times that in output drive portion 13, and the output source transistor exactly tracks the mirror drive transistor 40. In a preferred form, transistor 40 and transistors 50-54 are each implemented with a gate width-to-length dimension of "28/7" microns. It should again be well understood that the gate dimensions mentioned are provided by way of example only and may otherwise be varied in accordance with the principles of the present invention.

By now it should be apparent that a differential amplifier which utilizes transistor size ratioing of series-connected load transistors to provide minimum systematic offset voltage, low noise and good drive capability has been provided. By using transistor size matching, the quiescent current of the differential amplifier is substantially insensitive to changes in processing and temperature. The present invention may be used in connection with differential amplifiers of varying structures.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A differential amplifier having a differential input pair of transistors for receiving first and second input voltages and providing an output voltage proportional to a differential of the first and second input voltages, further comprising:

a plurality of series-connected load transistors coupled to each transistor of the differential input pair of transistors, said series-connected load transistors each having a control electrode connected together and to one transistor of the input of transistors, each of said series-connected load transistors having substantially equal first predetremined ocntrol electrode width and length dimensions which form a first composite predetermined control electrode dimension; and an output stage coupled to the differential input pair of transistors and to the first plurality of series-connected transistors, said output stage having a source output transistor and a sink output transistor, the sink output transistor being implemented by a plurality of parallel-connected sink transistors, each of said parallel-connected sink transistors having substantially the same first predetermined control electrode width and length dimensions to form a second composite predetermined control electrode dimension ratioed in a predetermined ratio with the first composite predetermined control electrode dimension.

2. The differential amplifier of claim 1 wherein the first composite predetermined control electrode dimension has a first width substantially smaller than a second electrode dimension, and has a first length substantially larger than a second length of the second composite predetermined control electrode dimension.

3. The differential amplifier of claim 1 further comprising:

a drive stage coupled to the load transistors and to the output stage, for improving output slew rate of the differential amplifier, said drive stage having a transistor of a first conductivity type which is size ratioed with the source output transistor by having substantially equal second predetermined control electrode width and length dimensions, and having a transistor of a second conductivity type which is size ratioed with each of the sink transistors by having a control electrode dimension substantially equal to the first predetermined control electrode dimension.

4. A method of providing a process insensitive differential amplifier having improved offset voltage compensation, comprising the steps of:

providing a differential input pair of transistors for receiving differential input voltages;

coupling a plurality of series-connected load transistors to each transistor of the input pair of transistors, the load transistors each having a control electrode connected together and to a first transistor of the input pair of transistors, each control electrode having a first predetermined control electrode width/length dimension to form a first composite predetermined control electrode dimension; and coupling an output stage to the load transistors, said output stage providing an output voltage of the differential amplifier and having a source transistor coupled in series with a sink transistor, said sink transistor implemented by a plurality of parallel-connected transistors, the parallel-connected transistors each having a control electrode connected together and to a second transistor of the input pair of transistors, each control electrode having a second predetermined control electrode width/length dimension to form a second composite predetermined control electrode dimension ratioed in a predetermined ratio with the first composite predetermined control electrode dimension.

5. A process insensitive differential amplifier having improved offset voltage correction, comprising:

a first transistor of a first conductivity type having a first current electrode coupled to a power supply voltage, a second current electrode, and a control electrode for receiving a bias voltage;

a second transistor of the first conductivity type having a first current electrode coupled to the second current electrode of the first transistor, a control electrode for receiving a first input voltage, and a second current electrode;

a third transistor of the first conductivity type having a first current electrode coupled to the second current electrode of the first transistor, a control electrode for receiving a second input voltage, and a second current electrode for providing an output terminal;

a first plurality of transistors of a second conductivity type coupled in series between the second current electrode of the second transistor and a second power supply voltage, each of said transistors of the first plurality having a control electrode connected together and to the second current electrode of the second transistor with a first predetermined control electrode dimension to form a first composite predetermined control electrode dimension;

a second plurality of transistors of the second conductivity type coupled in series between the second current electrode of the third transistor and the second power supply voltage, said first plurality being equal in number to the second plurality, and each transistor of the second plurality having a control electrode connected together and to the second current electrode of the third transistor and having the first predetermined control electrode dimension to form the first composite predetermined control electrode dimension; and an output stage coupled to the output terminal, said output stage having a sink transistor comprising a third plurality of transistors of the second conducitvity type coupled in parallel, each of the transistors of said third plurality also having a control electrode with the substantailly equal first predetermined control electrode dimension to form a second composite predetermined control electrode dimension ratioed in a predetermined ratio with the first composite predetermined control electrode dimension.

6. The differential amplifier of claim 5 further comprising:

a fourth transistor of the second conductivity type having a first current electrode, a control electrode coupled to the second current electrode of the second transistor, and a second current electrode coupled to the second power supply voltage, said fourth transistor having a control electrode dimension substantially equal to the first predetermined control electrode dimension; and a fifth transistor of the first conductivity type having a first current electrode coupled to the first power supply voltage, a second current electrode connected to a control electrode thereof and coupled to both the first current electrode of the fourth transistor and to the output stage, said fourth and fifth transistors providing a faster output slew rate for the differential amplifier.

* * * * *

UNITED STATES PATENT AND TRADEMARK OFFICE
CERTIFICATE OF CORRECTION

PATENT NO. : 4,706,036

DATED : November 10, 1987

INVENTOR(S) : Michael E. Rebeschini

It is certified that error appears in the above-identified patent and that said Letters Patent is hereby corrected as shown below:

In claim 1, column 5, line 67, insert the word --pair-- after "input".

In claim 1, column 6, lines 1-2, change "predetremined ocn-trol" to --predetermined control--.

In claim 2, column 6, line 21, after "second" insert --width of the second composite predetermined control--.

Signed and Sealed this

Twenty-ninth Day of March, 1988

Attest:

DONALD J. QUIGG

*Attesting Officer*   *Commissioner of Patents and Trademarks*